(12) United States Patent
Hirszhorn et al.

(10) Patent No.: US 11,060,981 B2
(45) Date of Patent: Jul. 13, 2021

(54) GUIDED INSPECTION OF A SEMICONDUCTOR WAFER BASED ON SPATIAL DENSITY ANALYSIS

(71) Applicant: Applied Materials Israel Ltd., Rehovot (IL)

(72) Inventors: Ariel Hirszhorn, Ness-Ziona (IL); Yotam Sofer, Givataim (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 760 days.

(21) Appl. No.: 15/926,990

(22) Filed: Mar. 20, 2018

(65) Prior Publication Data
US 2019/0293569 A1    Sep. 26, 2019

(51) Int. Cl.
*G01N 21/95* (2006.01)
*G06T 7/00* (2017.01)
*G01N 21/956* (2006.01)

(52) U.S. Cl.
CPC ....... *G01N 21/9501* (2013.01); *G01N 21/956* (2013.01); *G06T 7/0004* (2013.01); *G06T 2207/30148* (2013.01)

(58) Field of Classification Search
CPC ............. G01N 21/9501; G01N 21/956; G01N 2021/8867; G06T 7/0004; G06T 2207/30148; H01L 22/12; H01L 22/24; H01L 22/34
See application file for complete search history.

(56) References Cited

U.S. PATENT DOCUMENTS

| 2009/0041332 A1* | 2/2009 | Bhaskar | G01N 21/93 382/145 |
| 2009/0074286 A1* | 3/2009 | Kitazawa | G01N 21/9501 382/144 |
| 2013/0202187 A1 | 8/2013 | Goren et al. | |
| 2019/0137892 A1 | 5/2019 | Cekli et al. | |
| 2019/0154593 A1 | 5/2019 | Urano et al. | |

FOREIGN PATENT DOCUMENTS

| JP | 2017129369 A | 7/2017 |
| TW | 201346298 A | 11/2013 |
| TW | 201805728 A | 2/2018 |
| WO | 2017203554 A1 | 11/2017 |

OTHER PUBLICATIONS

Taiwan Office Action for Taiwan Patent Application No. TW201346298, dated Oct. 21, 2019, 16 pages.

* cited by examiner

*Primary Examiner* — Chan S Park
*Assistant Examiner* — Elisa M Rice
(74) *Attorney, Agent, or Firm* — Lowenstein Sandler LLP (57) ABSTRACT

Samples at a semiconductor wafer that have been reviewed by a review tool may be identified. Furthermore, a candidate sample at the semiconductor wafer that has not been reviewed by the review tool may be identified. A location of the candidate sample at the semiconductor wafer may and a number of the samples that have been reviewed that are at locations proximate to the location of the candidate sample may be determined. The candidate sample may be selected for review by the review tool based on the number of the plurality of samples that are at locations proximate to the location of the candidate sample.

20 Claims, 5 Drawing Sheets

GUIDED INSPECTION OF A SEMICONDUCTOR WAFER BASED ON SPATIAL DENSITY ANALYSIS

TECHNICAL FIELD

The present disclosure generally relates to guided inspection, and more specifically, relates to guided inspection of a semiconductor wafer based on spatial density analysis.

BACKGROUND

Fabrication of a semiconductor device may utilize submicron features associated with ultra large scale integration. Such fabrication processes may require a formation of semiconductor device features with high precision and uniformity which may necessitate careful monitoring of the fabrication process. For example, frequent and detailed inspection of a semiconductor wafer may be performed to detect any defects of the semiconductor wafer. The detailed inspection may correspond to an analysis of an inspection image of the semiconductor wafer.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Implementations of the disclosure may correspond to a system that includes a memory and a processing device to identify samples at a semiconductor wafer that have been reviewed by a review tool and to identify a candidate sample at the semiconductor wafer that has not been reviewed by the review tool. The processing device may further determine a location of the candidate sample at the semiconductor wafer and determine a number of the samples that have been reviewed that are at locations proximate to the location of the candidate sample. Furthermore, the processing device may select the candidate sample for review by the review tool based on the number of the samples that are at locations proximate to the location of the candidate.

In some implementations, to select the candidate sample for review by the review tool based on the number of the plurality of samples that are at locations proximate to the location of the candidate sample, the processing device may further provide the candidate sample to the review tool when the number of the plurality of samples that are at locations proximate to the location of the candidate sample does not satisfy a threshold number.

In some implementations, the processing device may identify a subsequent candidate sample at the semiconductor wafer that has not been reviewed by the review tool, determine a subsequent location of the subsequent candidate sample at the semiconductor wafer, determine a number of samples comprising the plurality of samples and the candidate sample that have been reviewed that are at locations proximate to the subsequent location of the subsequent candidate sample, and select the subsequent candidate sample to be reviewed by the review tool based on the number of the samples that are at locations proximate to the subsequent location of the subsequent candidate sample.

In some implementations, to select the candidate sample for review by the review tool based on the number of the plurality of samples that are at locations proximate to the location of the candidate sample, the processing device may further identify a die of the semiconductor wafer that includes the candidate sample where the locations of the plurality of samples that have been reviewed that are proximate to the location of the candidate sample are at the die that includes the candidate sample.

In some implementations, the review tool corresponds to a scanning electron microscope (SEM).

In some implementations, the selection of the candidate sample for review by the review tool is further based on classification results of the plurality of samples at a semiconductor wafer that have been reviewed by a review tool.

In some implementations, the selection of the candidate sample for review by the review tool based on the number of the plurality of samples that are at locations proximate to the location of the candidate sample is associated with a density of the plurality of samples that have been previously reviewed by the review tool.

In some implementations, a method may identify samples at a semiconductor wafer that have been reviewed by a review tool, identify a candidate sample at the semiconductor wafer that has not been reviewed by the review tool, determine a location of the candidate sample at the semiconductor wafer, determine a number of the samples that have been reviewed that are at locations proximate to the location of the candidate sample, and select the candidate sample for review by the review tool based on the number of the samples that are at locations proximate to the location of the candidate.

In some implementations, a non-transitory computer readable medium may include instructions, which when executed by a processing device, cause the processing device to identify samples at a semiconductor wafer that have been reviewed by a review tool, identify a candidate sample at the semiconductor wafer that has not been reviewed by the review tool, determine a location of the candidate sample at the semiconductor wafer, determine a number of the samples that have been reviewed that are at locations proximate to the location of the candidate sample, and select the candidate sample for review by the review tool based on the number of the samples that are at locations proximate to the location of the candidate.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to guided inspection of a semiconductor wafer based on spatial density analysis. In general, a semiconductor wafer inspection system may be used to perform an examination of a semiconductor wafer. For example, the semiconductor wafer inspection system may be used to identify defects at the semiconductor wafer.

The semiconductor wafer inspection system may include an optical tool and a defect review tool. For example, the optical tool may be used to identify potential or candidate defects at a semiconductor wafer after or during a fabrication process. Subsequently, the defect review tool may be used to review, classify, or determine whether the candidate defects are actual defects or are not defects (e.g., a 'false alarm'). The semiconductor wafer may be fabricated with increasingly smaller features and the inspection of these smaller features may be accompanied by a particular amount of inspection noise. Since the features are increasingly smaller and the semiconductor wafer inspection system is associated with a particular amount of inspection noise, the smaller features of the semiconductor wafer may be identified as potential defects that are to be reviewed by the defect review tool to ascertain as to whether these are actual defects or false alarms. Since there may be a large number of features on the semiconductor wafer that are identified as potential defects, reviewing each of the potential defects may utilize a large amount of time.

Aspects of the present disclosure address the above and other deficiencies by guiding an inspection of a semiconductor wafer based on spatial density analysis. For example, the inspection of a semiconductor wafer may be based on locations of potential defects at the semiconductor wafer that have been previously reviewed. For example, the optical tool may identify a number of candidate defects at the semiconductor wafer. A first subset of the candidate defects may be identified and provided to the defect review tool to determine whether any of the candidate defects from the first subset are actual defects or not defects. Subsequently, a second subset of the candidate defects may be identified based on the locations of the candidate defects from the first subset that were previously reviewed. The candidate defects for the second subset may be identified based on the density of locations of the candidate defects on the semiconductor wafer that were previously reviewed. For example, the candidate defects in the second subset may be selected so that the locations of the candidate defects in the second subset combined with the locations of the candidate defects in the first subset are approximately evenly distributed across the semiconductor wafer. As such, the inspection of the semiconductor wafer may be guided or may actively learn based on the locations of the candidate defects that were previously reviewed. For example, the inspection of the semiconductor wafer may include an iterative defect sampling that is used to select a subset of candidate samples to be reviewed based on locations of samples that were previously reviewed in previous iterations.

Advantages of the present disclosure include, but are not limited to, an improved defect system that results from decreasing the amount of time to identify actual defects at the semiconductor wafer. For example, since the inspection of the semiconductor wafer may be based on iterations of subsets of potential defects that are selected based on locations of the prior reviewed potential defects, the potential defects that are reviewed may be representative across the semiconductor wafer instead of being concentrated in a particular location of the semiconductor wafer. Thus, an increased number of different types of potential defects may be analyzed and the inspection of the semiconductor wafer may result in more extensive defect information that is obtained in less amount of time. For example, different classifications of different types of defects may be identified.

Figure 1:
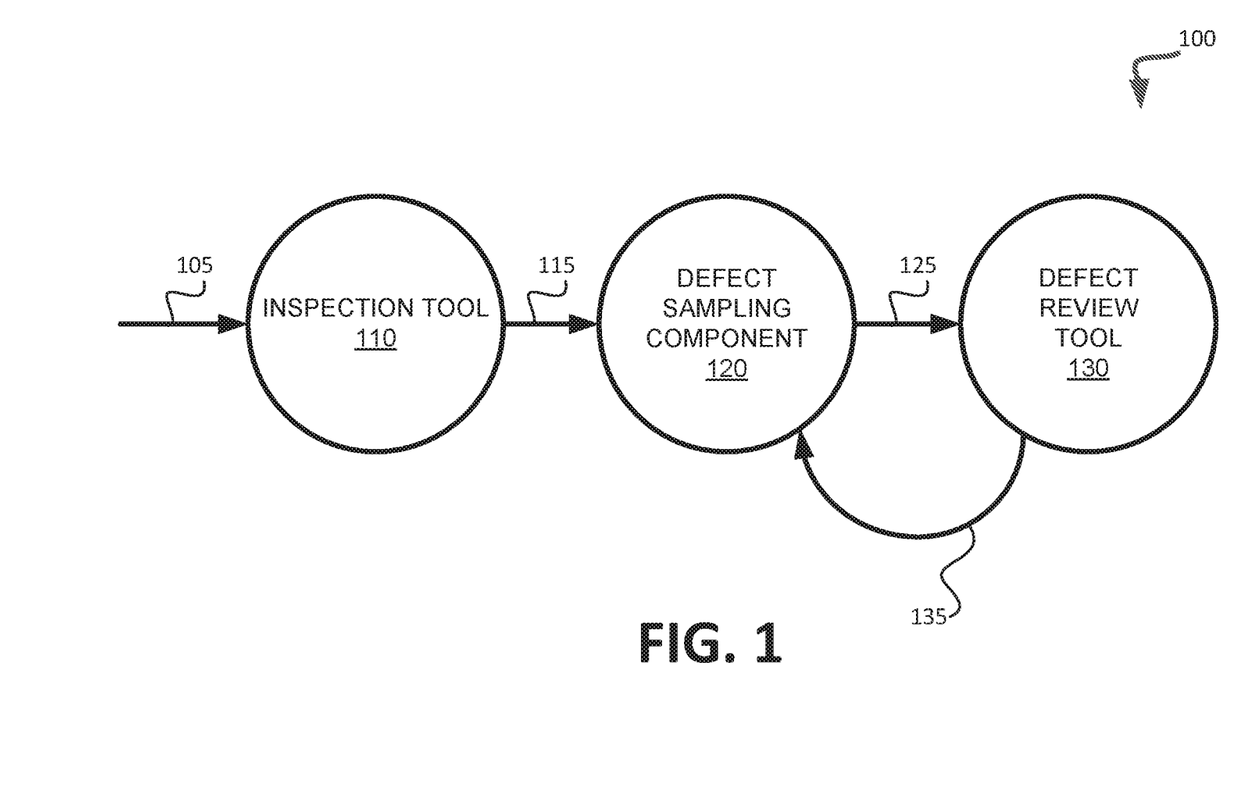
FIG. 1 illustrates an example environment of a guided inspection system in accordance with some embodiments of the present disclosure.

FIG. 1 illustrates an example environment of a guided inspection system 100. In general, the guided inspection system 100 may include an inspection tool 110, a defect sampling component 120, and a defect review tool 130.

As shown in FIG. 1, the guided inspection system 100 includes an inspection tool 110 that may be used to provide information from an examination of an object (e.g., a sample from a semiconductor wafer) for defects as a part of a semiconductor fabrication process. The examination can be part of the semiconductor fabrication process and may be carried out during the fabrication of the object. The guided inspection system 100 may further automatically determine semiconductor defect-related information using images obtained during or after object fabrication. For example, the inspection tool 110 may receive inputs 105 and may generate a map of potential or candidate defects (e.g., candidate samples) at the semiconductor wafer. The inputs 105 may include, but are not limited to, an image of a semiconductor wafer, design data (e.g., computer aided design (CAD) data specify structures of a design that includes objects), or regions of interest information that specifies particular portions of the semiconductor wafer that have been identified by a user. In some embodiments, the inspection tool 110 may be configured to capture inspection images. For example, the inspection tool 110 may utilize a high-speed and/or low resolution optical system to obtain an image of a semiconductor wafer. The resulting image may be informative of potential defects.

The inspection data 115 from the inspection tool 110 may be provided to a defect sampling component 120. The inspection data 115 may identify locations of potential defects at the semiconductor wafer. In some embodiments, the defect sampling component 120 may be part of a defect detection system. The defect detection system may be configured to process the received inspection data 115 to select candidate samples (e.g., potential defects) for review. For example, the defect sampling component 120 may select one or more of the potential defects or samples from the inspection data 115 to the defect review tool 130 to determine whether the potential defects are actual defects or are not actual defects (e.g., false alarms) and may classify any actual defects. The defect review tool 130 may be configured to capture review images of at least part or a subset of the potential defects detected by inspection tool 110 and selected by the defect sampling component 120. For example, the defect review tool 130 may include a low-speed and/or high-resolution optical system relative to the high-speed and/or low-resolution optical system of the inspection tool 110. In some embodiments, the defect review tool 130 may be a scanning electron microscope (SEM). The output 135 of the defect review tool 130 may then be provided to the defect sampling component 120 to select additional potential defects to be reviewed by the defect review tool 130.

In operation, the inspection tool 110 may identify locations of potential defects at the semiconductor wafer. The inspection tool 110 may provide the locations of the potential defects to the defect sampling component 120. Subsequently, the defect sampling component 120 may perform an iterative selection process for subsets of the potential defects that have been identified by the inspection tool 110. For example, a first subset of the potential defects may be selected and provided to the defect review tool 130 for classification of the potential defects from the first subset. Defect information from these particular potential defects may then be received. Subsequently, this defect information may be used to identify potential defects for a second subset of the potential defects that are to be reviewed by the defect review tool 130. The potential defects selected for the second subset may be identified as not being similar to other potential defects that have been previously reviewed and may be identified based on a distribution of the potential defects that have been previously reviewed.

In some embodiments, the inspection tool 110, defect sampling component 120, and defect review tool 130 may be different tools located at the same or at different locations, or a single tool operated in different modes. In the latter case, the tool may be first operated with lower resolution and high speed to obtain images of all or at least a large part of the relevant areas of the object (e.g., corresponding to the inspection image of the inspection tool 110). Once potential defects are detected, the tool can be operated at a higher resolution and possibly lower speed for examining specific locations associated with the potential defects (e.g., corresponding to the operations of the defect review tool 130). In some embodiments, the functionality described herein may be implemented in a defect review tool. For example, the defect review tool may perform operations corresponding to the defect sampling component 120 for selecting potential defects that are to be reviewed in particular iterations by the defect review tool. In some embodiments, the defect sampling component 120 may be implemented in a standalone tool or server. For example, the defect inspection system may be implemented in a distributed environment where the inspection review tool, defect sampling component, and the defect review tool are coupled to each other via networks.

Figure 2:
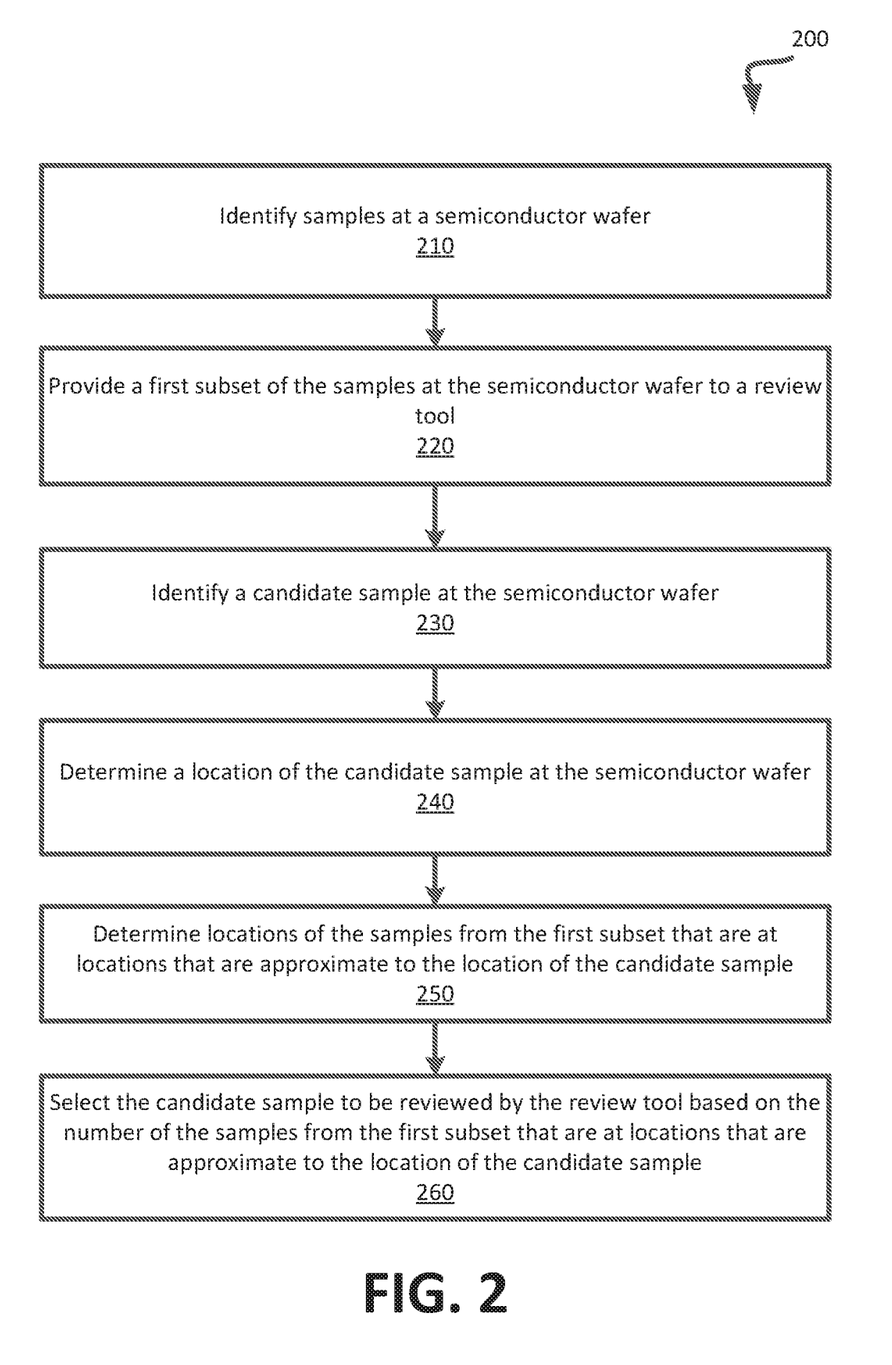
FIG. 2 is a flow diagram of an example method to select a candidate sample for review by a review tool based on locations of previously reviewed candidate samples in accordance with some embodiments.

FIG. 2 is a flow diagram of an example method 200 to select a candidate sample to be reviewed by a review tool based on locations of previously reviewed candidate samples. The method 200 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 may be performed by the defect sampling component 120 of FIG. 1.

As shown in FIG. 2, the method 200 may begin, at block 210, with processing logic identifying samples at a semiconductor wafer. For example, an inspection tool may identify potential or candidate defects at the semiconductor wafer. In some embodiments, the potential or candidate defects may be identified from input data received and analyzed by the inspection tool. For example, the inspection tool may receive or generate an image of the semiconductor wafer, design data of the semiconductor wafer (e.g., computer aided design (CAD) data), region of interest (ROI) data (e.g., information specified by a user or process that indicates or delineates portions of the semiconductor wafer that may include potential defects), or other such sources of data. The potential or candidate defects may be identified or marked on a map of the semiconductor wafer where the map indicates the locations of the potential or candidate defects at positions along the semiconductor wafer. The processing logic may subsequently provide a first subset of the samples at the semiconductor wafer to a review tool (block 220). For example, a first number or a proper subset of the candidate defects at the semiconductor wafer may be provided to be reviewed by the review tool. The first number of the candidate defects may be selected based on locations that are evenly or approximately evenly distributed across the semiconductor wafer. For example, if the semiconductor wafer includes ten die and if 100 potential defects are included in the first subset, then ten potential defects from each die may be included in the first subset. In the same or alternative embodiments, a number of potential defects from each die may be selected so that a range of potential defects are selected from each die. For example, a range of eight to twelve potential defects may be selected from each die (or other such proximate locations). A classification and/or determination of whether the candidate defects were actual defects or not actual defects (e.g., false alarms) may be received from the review tool. The processing logic may identify a candidate sample at the semiconductor wafer (block 230). For example, a potential defect that has not yet been reviewed by the review tool may be identified. The potential defect may include attributes or characteristics that do not match other potential defects that have been previously reviewed by the review tool. For example, a signature of the identified candidate sample may not match a signature of a previously reviewed sample. The processing logic may further determine a location of the candidate sample at the semiconductor wafer (block 240) and may determine locations of the candidate samples from the first subset that are at locations that are approximate to the location of the candidate sample (block 250). For example, a number of previously reviewed candidate samples that are within a threshold distance of the location of the candidate sample or a number of previously reviewed samples that are on the same die as the candidate sample may be identified. In some embodiments, a density (e.g., number of reviewed samples on the semiconductor wafer) in an area that includes the candidate sample may be identified. Subsequently, the processing logic may select the candidate sample to be reviewed by the review tool based on the number of the samples from the first subset that are at locations that are proximate to the location of the candidate sample (block 260). For example, the candidate sample that has not yet been reviewed may be included in a second subset of candidate samples that are to be provided to the review tool. The candidate sample may be included in the second subset if the distribution of the location of the candidate sample in conjunction with the previously reviewed samples are approximately evenly distributed across the semiconductor wafer. For example, the candidate sample may be included in the second subset based on the number of previously reviewed defects per die of the semiconductor wafer and the number of previously defects on the die that includes the candidate sample.

Figure 3A:
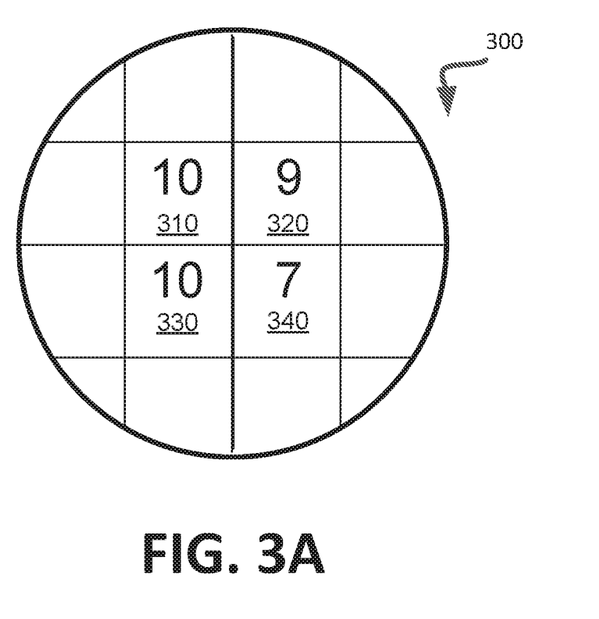
FIG. 3A illustrates a semiconductor wafer with a first distribution of reviewed samples in accordance with some embodiments.

FIG. 3A illustrates a semiconductor wafer with a first distribution 300 of reviewed samples. The distribution 300 may include potential defects that were selected by the defect sampling component 120 of FIG. 1.

As shown in FIG. 3A, the distribution 300 may include a map of a semiconductor wafer with locations of potential defects that have been reviewed by a review tool. For example, the semiconductor wafer may include numerous dies such as die 310, die 320, die 330, and die 340. The distribution 300 may include potential defects that were previously reviewed by a review tool to determine whether the potential defects were actual defects or not actual defects. As shown, the die 310 may include ten potential defects that have been reviewed, the die 320 may include nine potential defects that have been previously reviewed, the die 330 may include ten potential defects that have been reviewed, and the die 340 may include seven potential defects that have been previously reviewed. The previously reviewed defects of the distribution 300 may be part of a first subset of potential defects that have been identified for the semiconductor wafer.

Figure 3B:
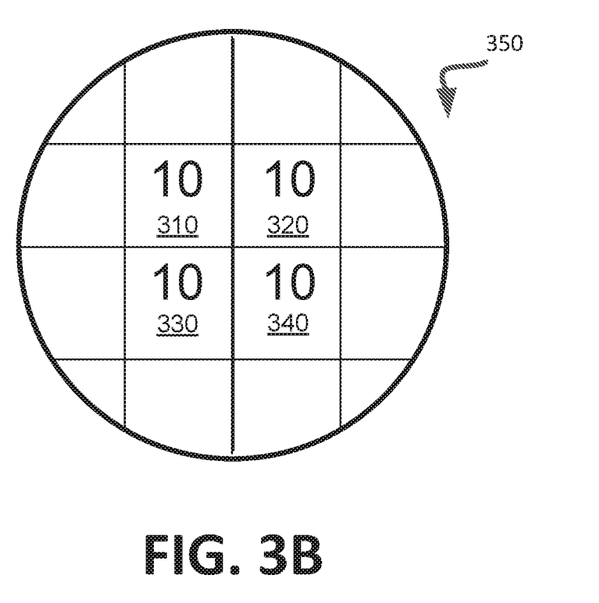
FIG. 3B illustrates a semiconductor wafer with a first distribution of reviewed samples in accordance with some embodiments.

FIG. 3B illustrates a semiconductor wafer with a second distribution 350 of reviewed samples. The distribution 350 may include additional potential defects that were selected by the defect sampling component 120 of FIG. 1.

As shown in FIG. 3B, the distribution 350 may include the previously reviewed defects of the distribution 300 and additional defects that have been subsequently reviewed as part of a second subset of potential defects of the semiconductor wafer. Additional defects may then be selected to be reviewed by the review tool based on the distribution 300. For example, as shown, potential defects from the die 320 and the die 340 may be selected to be reviewed by the review tool so that the distribution 350 of potential defects that have been reviewed are evenly distributed. For example, each die 310, 320, 330, and 340 include the same number of potential defects that have been reviewed by the review tool.

Although the distribution to be achieved is described as an even distribution on a per die basis, any such approximate distribution may be used when selecting additional potential defects to be reviewed. For example, the potential defects selected to complete the distribution 350 may be for each die to include a range of potential defects (e.g., for each die 310, 320, 330, and 340 to include between a lower number and an upper number of potential defects that have been reviewed by the review tool). In some embodiments, the approximate distribution may correspond to a number of previously reviewed potential defects within a threshold distance of a selected potential defect.

Figure 4:
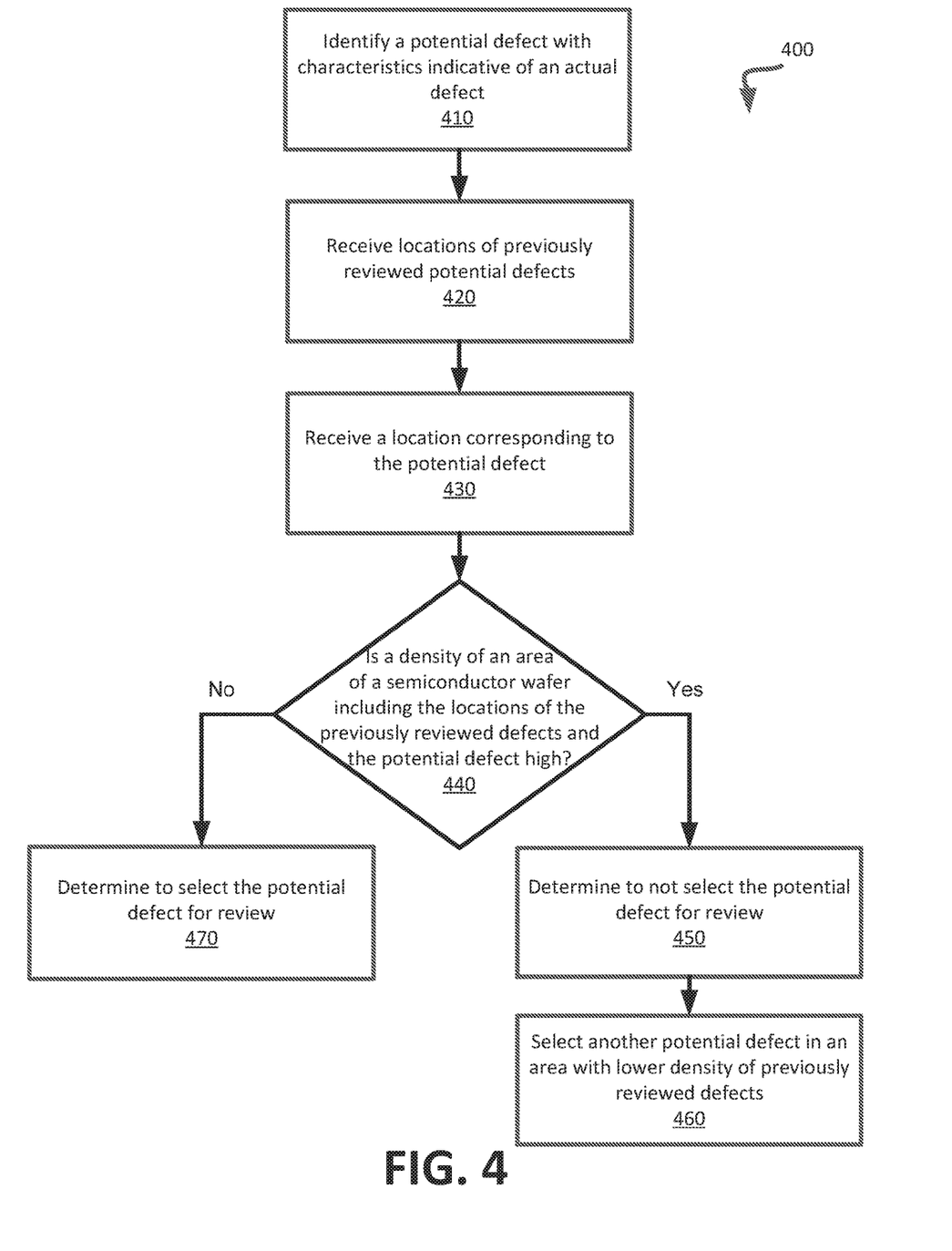
FIG. 4 is a flow diagram of an example method to iteratively select a subset of samples for review based on a density of previously reviewed samples in accordance with some embodiments of the present disclosure.

FIG. 4 is a flow diagram of an example method 400 to iteratively select a subset of samples for review based on a density of previously reviewed samples. The method 400 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 may be performed by the defect sampling component 120 of FIG. 1.

As shown in FIG. 4, the method 400 may begin, at block 410, with processing logic identifying a potential defect with characteristics indicative of an actual defect. For example, the potential defect that has been identified may share a characteristic with a previously reviewed potential defect that was classified as an actual defect. The processing logic may further receive locations of previously reviewed potential defects (block 420). For example, the previously reviewed potential defects may have been selected in previous iterations of a defect sampling process as previously described. The processing logic may further receive a location corresponding to the potential defect that has been identified (block 430). Subsequently, the processing logic may determine whether a density of an area of a semiconductor wafer that includes the locations of the previously reviewed defects and the potential defects is high (block 440). For example, the determination may be based on a comparison of a density of the area of the semiconductor wafer that includes the location of the identified potential defect with the densities of areas of the semiconductor wafer that do not include the location of the identified potential defect. If the density of the area of the semiconductors wafer is high relative to the densities of the other areas of the semiconductor wafer, then the processing logic may determine to not select the potential defect for review (block 450) and may instead select another potential defect in an area of the semiconductor wafer with a lower density of previously reviewed defects (block 460). In some embodiments, the potential defect that was not selected to be reviewed may be selected at another time or a subsequent iteration of the defect sampling process when the density of the area of the semiconductor wafer that includes this potential defect is later considered to be less dense than the other areas of the semiconductor wafer. Alternatively, if the processing logic determines that the density of the area of the semiconductors wafer is not high relative to the densities of the other areas of the semiconductor wafer (e.g., the density is lower than the density of other areas of the semiconductor wafer) then the processing logic may determine to select the potential defect for review (block 470). The selection of the potential defect for review may subsequently increase the density of the area of the semiconductor that includes the potential defect.

Figure 5:
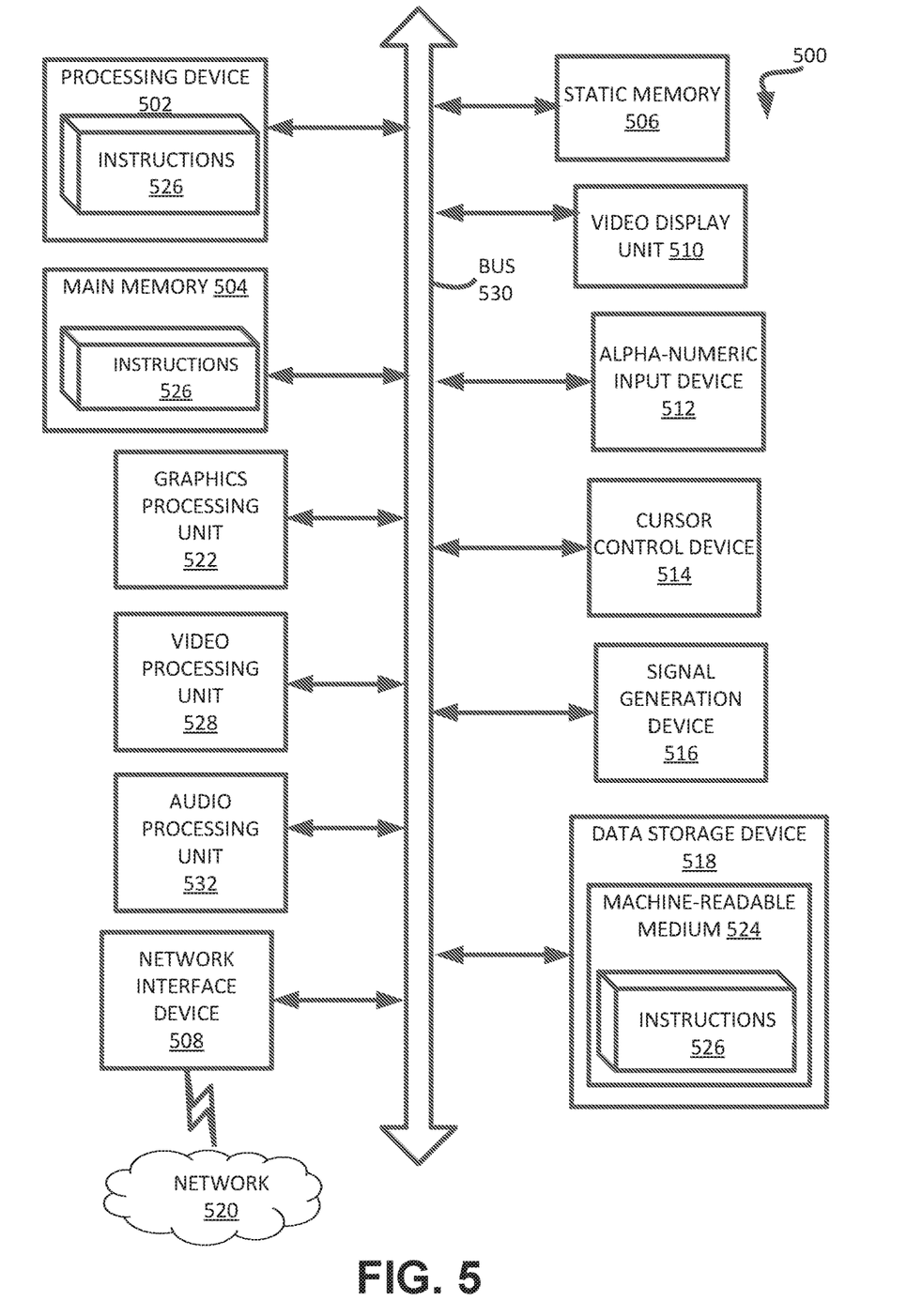
FIG. 5 is a block diagram of an example computer system in which implementations of the present disclosure may operate.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 804 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage device 518, which communicate with each other via a bus 530.

Processing device 502 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a computer-readable medium) on which is stored one or more sets of instructions or software 526 embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In one implementation, the instructions 526 include instructions to implement functionality corresponding to a defect sampling component (e.g., defect sampling component 120 of FIG. 1). While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "determining" or "executing" or "performing" or "collecting" or "creating" or "sending" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A system comprising:
a memory; and
a processing device, operatively coupled with the memory, to:
identify a plurality of samples at a semiconductor wafer that has been reviewed by a review tool;
identify a candidate sample at the semiconductor wafer that has not been reviewed by the review tool;
determine a location of the candidate sample at the semiconductor wafer;
determine a number of samples among the plurality of samples that have been reviewed that are at locations proximate to the location of the candidate sample; and select the candidate sample for review by the review tool based on the number of the samples among the plurality of samples that are at locations proximate to the location of the candidate sample.

2. The system of claim 1, wherein to select the candidate sample for review by the review tool based on the number of the samples among the plurality of samples that are at locations proximate to the location of the candidate sample, the processing device is further to:
provide the candidate sample to the review tool when the number of the samples among the plurality of samples that are at locations proximate to the location of the candidate sample does not satisfy a threshold number.

3. The system of claim 2, wherein the processing device is further to:
identify a subsequent candidate sample at the semiconductor wafer that has not been reviewed by the review tool;
determine a subsequent location of the subsequent candidate sample at the semiconductor wafer;
determine a number of samples comprising the plurality of samples and the candidate sample that have been reviewed that are at locations proximate to the subsequent location of the subsequent candidate sample; and
select the subsequent candidate sample to be reviewed by the review tool based on the number of the samples that are at locations proximate to the subsequent location of the subsequent candidate sample.

4. The system of claim 1, wherein to select the candidate sample for review by the review tool based on the number of the samples among the plurality of samples that are at locations proximate to the location of the candidate sample, the processing device is further to:
identify a die of the semiconductor wafer that includes the candidate sample, wherein the locations of the samples among the plurality of samples that have been reviewed that are proximate to the location of the candidate sample are at the die that includes the candidate sample.

5. The system of claim 1, wherein the review tool corresponds to a scanning electron microscope (SEM).

6. The system of claim 1, wherein the selection of the candidate sample for review by the review tool is further based on classification results of the plurality of samples at a semiconductor wafer that have been reviewed by a review tool.

7. The system of claim 1, wherein the selection of the candidate sample for review by the review tool based on the number of the samples among the plurality of samples that are at locations proximate to the location of the candidate sample is associated with a density of the plurality of samples that have been previously reviewed by the review tool.

8. A method comprising:
identifying a plurality of samples at a semiconductor wafer that have been reviewed by a review tool;
identifying a candidate sample at the semiconductor wafer that has not been reviewed by the review tool;
determining a location of the candidate sample at the semiconductor wafer;
determining, by a processing device, a number of samples among the plurality of samples that have been reviewed that are at locations proximate to the location of the candidate sample; and
selecting the candidate sample for review by the review tool based on the number of the samples among the plurality of samples that are at locations proximate to the location of the candidate sample.

9. The method of claim 8, selecting the candidate sample for review by the review tool based on the number of the samples among the plurality of samples that are at locations proximate to the location of the candidate sample comprises:
providing the candidate sample to the review tool when the number of the samples among the plurality of samples that are at locations proximate to the location of the candidate sample does not satisfy a threshold number.

10. The method of claim 9, the method further comprising:
identifying a subsequent candidate sample at the semiconductor wafer that has not been reviewed by the review tool;
determining a subsequent location of the subsequent candidate sample at the semiconductor wafer;
determining a number of samples comprising the plurality of samples and the candidate sample that have been reviewed that are at locations proximate to the subsequent location of the subsequent candidate sample; and
selecting the subsequent candidate sample to be reviewed by the review tool based on the number of the samples that are at locations proximate to the subsequent location of the subsequent candidate sample.

11. The method of claim 8, wherein selecting the candidate sample for review by the review tool based on the number of the samples among the plurality of samples that are at locations proximate to the location of the candidate sample comprises:
identifying a die of the semiconductor wafer that includes the candidate sample, wherein the locations of the samples among the plurality of samples that have been reviewed that are proximate to the location of the candidate sample are at the die that includes the candidate sample.

12. The method of claim 8, wherein the review tool corresponds to a scanning electron microscope (SEM).

13. The method of claim 8, wherein the selection of the candidate sample for review by the review tool is further based on classification results of the plurality of samples at a semiconductor wafer that have been reviewed by a review tool.

14. The method of claim 8, wherein the selection of the candidate sample for review by the review tool based on the number of the samples among the plurality of samples that are at locations proximate to the location of the candidate sample is associated with a density of the plurality of samples that have been previously reviewed by the review tool.

15. A non-transitory computer readable medium comprising instructions, which when executed by a processing device, cause the processing device to perform operations comprising:
identifying a plurality of samples at a semiconductor wafer that has been reviewed by a review tool;
identifying a candidate sample at the semiconductor wafer that has not been reviewed by the review tool;
determining a location of the candidate sample at the semiconductor wafer;
determining a number of samples among the plurality of samples that have been reviewed that are at locations proximate to the location of the candidate sample; and
selecting the candidate sample for review by the review tool based on the number of the samples among the plurality of samples that are at locations proximate to the location of the candidate sample.

16. The non-transitory computer readable medium of claim 15, wherein to select the candidate sample for review by the review tool based on the number of the samples among the plurality of samples that are at locations proximate to the location of the candidate sample, the operations further comprise:
  providing the candidate sample to the review tool when the number of the samples among the plurality of samples that are at locations proximate to the location of the candidate sample does not satisfy a threshold number.

17. The non-transitory computer readable medium of claim 16, wherein the operations further comprise:
  identifying a subsequent candidate sample at the semiconductor wafer that has not been reviewed by the review tool;
  determining a subsequent location of the subsequent candidate sample at the semiconductor wafer;
  determining a number of samples comprising the plurality of samples and the candidate sample that have been reviewed that are at locations proximate to the subsequent location of the subsequent candidate sample; and
  selecting the subsequent candidate sample to be reviewed by the review tool based on the number of the samples that are at locations proximate to the subsequent location of the subsequent candidate sample.

18. The non-transitory computer readable medium of claim 15, wherein to select the candidate sample for review by the review tool based on the number of the samples among the plurality of samples that are at locations proximate to the location of the candidate sample, the operations further comprise:
  identifying a die of the semiconductor wafer that includes the candidate sample, wherein the locations of the samples among the plurality of samples that have been reviewed that are proximate to the location of the candidate sample are at the die that includes the candidate sample.

19. The non-transitory computer readable medium of claim 15, wherein the review tool corresponds to a scanning electron microscope (SEM).

20. The non-transitory computer readable medium of claim 15, wherein the selection of the candidate sample for review by the review tool is further based on classification results of the plurality of samples at a semiconductor wafer that have been reviewed by a review tool.

* * * * *